United States Patent
Grabinger et al.

(10) Patent No.: US 7,622,828 B2
(45) Date of Patent: Nov. 24, 2009

(54) LOADED TRIAC OUTPUT SYSTEM

(75) Inventors: Cory L. Grabinger, Maple Grove, MN (US); Ivo Chromy, Brno (CZ)

(73) Assignee: Honeywell International Inc., Morristown, NJ (US)

( * ) Notice: Subject to any disclaimer, the term of this patent is extended or adjusted under 35 U.S.C. 154(b) by 213 days.

(21) Appl. No.: 11/277,112

(22) Filed: Mar. 21, 2006

(65) Prior Publication Data
US 2007/0222300 A1 Sep. 27, 2007

(51) Int. Cl.
*H01H 47/00* (2006.01)
(52) U.S. Cl. .................. 307/116; 307/125; 307/131; 307/139
(58) Field of Classification Search .................. None
See application file for complete search history.

(56) References Cited

U.S. PATENT DOCUMENTS

| | | | |
|---|---|---|---|
| 3,743,860 A * | 7/1973 | Rossell | 327/452 |
| 4,258,295 A * | 3/1981 | Siglock | 315/189 |
| 4,358,729 A | 11/1982 | Hart | |
| 4,560,909 A * | 12/1985 | Peil | 315/291 |
| 4,859,926 A * | 8/1989 | Wolze | 323/241 |
| 5,444,309 A | 8/1995 | Innes et al. | |
| 5,604,411 A * | 2/1997 | Venkitasubrahmanian et al. | 315/307 |
| 5,994,848 A * | 11/1999 | Janczak | 315/224 |
| 6,144,169 A * | 11/2000 | Janczak | 315/224 |
| 6,509,724 B1 * | 1/2003 | Ilic et al. | 323/284 |
| 6,657,401 B2 * | 12/2003 | Kominami et al. | 315/291 |
| 6,707,263 B1 | 3/2004 | Prasad | |
| 6,998,792 B2 * | 2/2006 | Takahashi et al. | 315/248 |

* cited by examiner

*Primary Examiner*—Stephen W Jackson
*Assistant Examiner*—Adi Amrany

(57) ABSTRACT

The interfacing of a controller having an output with components (e.g., a triac) that require more current to successfully drive than the amount of current that is drawn by the circuit or controller which is being driven. The extra current drawn may be efficiently used, rather than wasted, for other circuitry such as a power supply for the electronics of the controllers or other devices. Also, another source may automatically come into place to provide current for the power supply or other circuitry when the driving controller becomes inactive.

5 Claims, 2 Drawing Sheets

LOADED TRIAC OUTPUT SYSTEM

BACKGROUND

This invention pertains to actuators and particularly to actuator controls. More particularly, it pertains to interfacing among controllers. Actuators designed without microcontrollers that have floating control inputs may typically drive an actuator motor directly from the floating control input. This may cause a current link on the floating control input that is in line with the worst-case minimum input current required to keep a triac active on virtually all controllers (i.e., legacy and modem).

SUMMARY

The invention may be an interface for an actuator controller that may efficiently source enough current on a modem microcontroller driven actuator to maintain the worst-case minimum input current required by the triac output controller. The invention may help solve the technical challenge by diverting the sourced current from the regular power terminals to the floating control inputs by means of an appropriate voltage drop. This may provide the modem microcontroller driven actuator an advantage of backward compatibility with all controllers.

DESCRIPTION

The invention is a system that may be used for providing triac loading without wasting the current used for loading which may be needed if the output of the triac is connected to a high impedance mechanism, thus resulting in an efficient interface. Actuators designed without microcontrollers that have floating control inputs may typically drive an actuator motor directly from the floating control input. This may cause a current link on the floating control input that is in line with the worst-case minimum input current required to keep a triac active on virtually all controllers (i.e., legacy and modern). To avoid issues, the present invention may efficiently source enough current on a modern microcontroller driven actuator to maintain the worst-case minimum input current required by the triac output controller.

The invention solves the technical challenge by diverting the sourced current from the regular power terminals to the floating control inputs by means of an appropriate voltage drop. This may provide the modem microcontroller driven actuator an advantage of backward compatibility with all controllers.

The present invention may be effected by using a series of diodes to guarantee current flow from the floating inputs whenever the inputs are active. Essentially, it may incorporate an additional rectifier with a lower forward voltage drop. This lower voltage drop may force the current to take the easiest path to the power supply, which in this case is via the present floating control inputs. When the inputs are not being driven, input current may revert back to the normal power input terminals via the rectifier with the larger forward voltage drop.

The feasibility of the floating control scenario may be verified. One may measure the voltage drop on the diodes connected in series and verify that the voltage drops down when either of the floating inputs are used. This indicates that the input current changes its path to the power supply. It may be noted that several diodes were added to the design to assure the desired path of current to the power supply.

Figure 1:
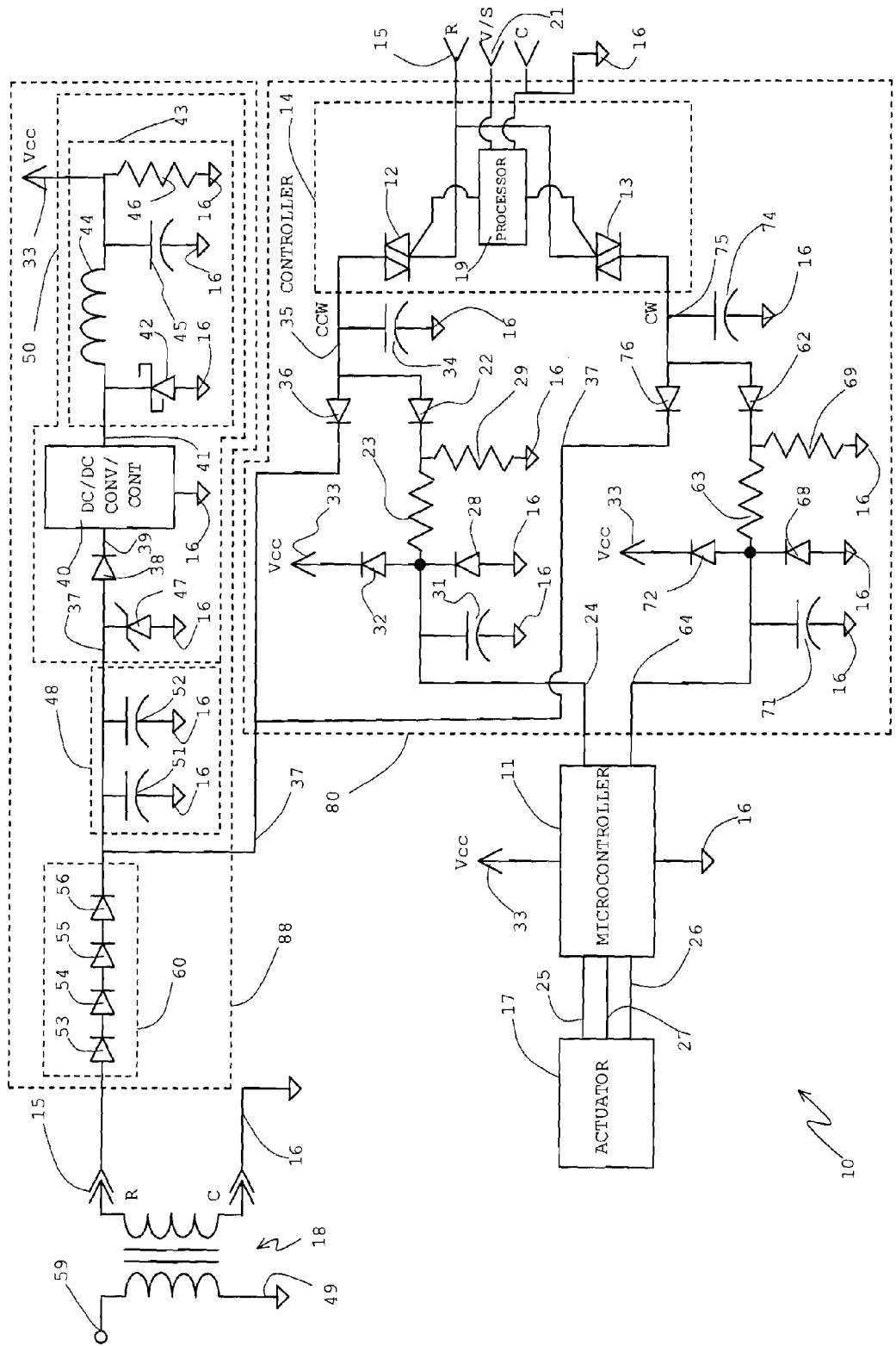
FIG. 1 is a schematic of a system for a controller interface.

FIG. 1 shows an illustrative, specific instance of the present invention. Other instances or examples may be used to illustrate the present invention. One application of this invention may be interfacing a legacy output controller with a modern actuator controller. A circuit or system 10 shows an application of providing low current triac signals to floating inputs of a microcontroller 11, an actuator microcontroller 11, or an overall controller 11. Signals to microcontroller 11 may originate from triacs 12 and 13 in a triac controller 14 or in an HVAC controller. Controller 14 and the circuitry for interfacing the controller 14 with the microcontroller 11, and possibly with other components of system 10, may be incorporated into an overall controller 80. The triacs may be substituted with other kinds of switches or solid state devices. An AC source having a rms voltage between 20 and 40 volts from secondary winding a step-down power transformer 18, which has its primary winding connected to a 120 volt, 60 cycle power line source across terminals 59 and 49 of the primary winding, may be provided across terminals 15 (R) and ground 16 (C). The terminal 49 to a ground may be isolated from the ground 16 of the secondary winding and the system circuit 10. The power line source may instead be of another voltage and cycle rate than indicated here.

The controller 14 may output one of several signals, for example, a counterclockwise directing signal or a clockwise signal destined for an actuator 17. A processor 19 may receive a signal at terminal 21 indicating whether and which direction the actuator 17 is to be activated. For instance, the actuator 17 may be connected to a damper in an air duct (e.g., it could be connected to a valve or other mechanism needing control). A signal at terminal 21, indicating that the actuator turn the damper counterclockwise (CCW), may go to the processor 19. Processor 19 may output a signal to a gate of triac 12. Triac 12 may be turned on with the gate signal and current may flow through the triac 12 from input 15, through diode 22 and a 27.4 K-ohm resistor 23 to an input 24 of the actuator microcontroller 11. Microcontroller 11 may be a PIC18F4431 part available from Microchip Technology Inc. Microcontroller 11 may have a high impedance input and does not need a large signal to effect an excitation signal on a line 25 from the microcontroller powerful enough to drive a sizable actuator 17 with significant torque to operate a large damper, valve, or the like, in a CCW direction. Actuator 17 may be a motor (e.g., brushless motor), solenoid, or the like. Line 26 may be another microcontroller 11 output for driving the actuator 17 in the opposite clockwise (CW) direction. Line 27 may be a common terminal or reference ground relative to lines 26 and 27. Line 27 may or may not be tied in with ground 16.

The CCW signal from triac 12 may appear as a half-wave rectified signal in view of diode 22 having its anode connected to the triac 12. Also, a diode 28 having an anode connected to the ground 16 and a cathode connected to input or line 24 may remove a significant portion of a negative signal on line 24. A 24.7 K-ohm resistor 29, connected to the cathode of diode 22, may be a pull-down resistor connected to the ground 16. There may be a 0.1 microfarad capacitor 31 connected between line 24 and ground 16. Capacitor 31 may operate as a filter, particularly in conjunction with resistor 23. A diode 32 may have an anode connected to line 24 and a cathode connected to Vcc 33. Diode 32 may suppress positive signals that exceed the voltage level of Vcc 33, particularly since the 24.7 K-ohm resistor 23 is in series with diode 32 relative to Vcc, which would realize the excess voltage as a voltage drop across it (the resistor). A 0.1 microfarad capacitor 34 may be connected between the output or line 35 of triac 12 and ground 16. Capacitor 34 may operate as a filter and/or storage.

At this extent of the description, the triac 12 may be turned on but there may not be sufficient current going from the output 35 through the noted circuitry to line or input 24 of microcontroller 11. Thus, a way to increase the current from line 15 through triac 12 to line 35 so that the minimum current required to keep triac 12 active is to attach a load on line 35. An easy solution would be to connect a resistor between line 35 and ground. However, that would be an inefficient approach resulting in a waste of electrical power. Also, this approach or other wasteful expenditure of power may cause problems with the circuit and associated components because of resulting generated heat, even a small amount, may cause failure of devices, integrated circuits, transistors, electrolytic capacitors, and other active and passive components. A solution may be to divert current from line 35 of the triac 12 to be used within the present circuit or system 10. A diode 36 may have an anode connected to line 35 and a cathode connected to a line 37. Line 37 may be connected to an anode of a diode 38. Diode 38 may have a cathode connected to an input 39 of a DC-to-DC voltage converter 40 which can constitute a switching power supply. The converter 40 may be a MC33063 part available from Fairchild Semiconductor Corporation. Converter 40 may output a voltage on line 41 which may provide electrical power for circuit or system 10. With this approach, current taken from triac 12 is sufficiently significant so that it may continue to operate in view of providing a very low current signal to input line 24 of the actuator microcontroller 11, and yet provide an efficient use of the taken current within the system 10.

A simplified example circuit 43, operating a power supply filter, at the output 41 of the converter 40 for providing the Vcc 33 supply to the system 10, may include a Schottky rectifier 42 having a cathode connected to line 41 and an anode connected to the ground 16. Rectifier or diode 42 may be a 10BQ060 part available from International Rectifier. A 1,000 microhenry inductor 44 may have one end connected to output or line 41 and another end connected to Vcc line 33. A 1,000 microfarad capacitor 45 may have one end connected to line 33 and the other end connected to ground 16. Also, there may be a 15 K-ohm resistor 46 connected between line 33 and ground 16. There may be other components, such as capacitors, connected between line 33 and ground 16.

On line 37, at the input side of converter 40, may be a zener diode 47 having a cathode connected to line 37 and an anode connected to ground 16. Diode 47 may be a P6SMB56AT3 part available from Semiconductor Components Industries, LLC. These components 47 and 38, converter 40 and filter 43 may constitute a power supply 50. Power supply 50 may also be regarded as a conditioning circuit, or referred to with another appropriate name. Also, there may be a storage circuit 48 that may have four or so 220 microfarad capacitors (two capacitors 51 and 52 are shown) connected between line 37 and ground 16. Circuit 48 may also be referred to as a filter or a part of one, or another appropriate name.

At this point of the description, it can be noted that current needed to sustain the operation of triac 12 may be used to sustain the power supply 50 for Vcc 33. However, when the current of the triac is absent, then the power supply may be sustained by a current from the secondary winding of the transformer 18 connected to terminals 15 and ground 16. A goal that may be achieved by circuit 10 is that when a triac (12 or 13) is on, current is being provided from it for the power supply 50, and then when the triacs are off, the current source may be from the transformer 18. To effect a current source selection scheme is to have each source with a different voltage presented to line 37. It may be again noted the ultimate source is the transformer 18 at terminal 15 relative to ground 16, even with respect to the triacs 12 and 13. The voltage drops between the two immediate sources may be different. The source with the smaller voltage drop should be the prevailing current source. The source via triac 12 and diode 36 may be regarded as having less than three diode voltage drops in a series below the terminal 15 voltage. The other voltage source via four diodes 53, 54, 55 and 56 of diode module 60 may be regarded as having about four diode voltage drops cumulatively below the terminal 15 voltage. The number of diode voltage drops or diodes may be other than four. The voltage difference between the two sources may be at least one diode drop. Diode module 60 may also be regarded as a voltage drop circuit or a supply circuit, or referred to with another appropriate name. Circuits 48, 50 and 60 may be referred to as an interface circuit 88.

Diode 53 may have its anode connected to terminal 15, diode 54 may have its anode connected to a cathode of diode 53, diode 55 may have its anode connected to a cathode of diode 54, and diode 56 may have its anode connected to a cathode of diode 55. A cathode of diode 56 may be connected to the input or line 37 to the switching power supply circuit 50. So if the triac 12 or 13 is on or activated, the voltage level at the cathode of diode 36 may be greater than the voltage available from diode. Thus, no current flow is available through diode 56 since there is not a sufficient positive drop from anode to cathode across at least diode 56 for a forward current flow, and there may be virtually no reverse current flow because of the diode characteristic. If triac 12 or 13 is off or inactivated, there is not a sufficient positive voltage drop from anode to cathode across diode 36 for a forward current flow, and there may be virtually no reverse current flow because of the diode action. Thus, there may be current flow from only diode 56 to line 37 when the triacs 12 and 13 are off, or there may be current flow only from diode 36 when triac 12 or 13 is on. It may be noted that the voltage at both diodes 36 and 56 have similar waveforms which are in phase due to their common source at terminal 15. Virtually all of the current provoked from triacs 12 and 13 may be utilized by system 10, resulting in significant efficiency in keeping the triacs on. The triacs 12 and 13 may be on just long enough to effect a CCW or CW movement of actuator 17 as needed.

Relative to getting the actuator 17 to operate in a CW manner, the components and operations may be of the same nature as those for getting the actuator to operate in the CCW manner. Components and lines 75, 76, 74, 62, 69, 63, 68, 72, 71 and 64 of the CW control portion may correspond to components and lines 35, 36, 34, 22, 29, 23, 28, 32, 31 and 24, in the given order, respectively, of the CCW control portion.

A signal on the gate of triac 13 may result in a small current signal on output line 75 through a diode 62 and 27.4 K-ohm resistor 63 to an input or line 64 for microcontroller 11 so as to provide a signal or power via line 26 to initiate CW movement of the actuator 17. A 0.1 microfarad capacitor 74 may be connected from line 75 to ground 16. A 27.4 K-ohm resistor 69 may be connected from the cathode of diode 62 to ground 16. A diode 68 may have a cathode connected to line 64 and an anode connected to ground 16. A diode 72 may have an anode connected to line 64 and a cathode connected to Vcc 33. A 0.1 microfarad capacitor 71 may have one end connected to line 64 and the other end connected to ground 16.

The purposes and operational aspects of these components of the CW portion may be similar to those purposes and aspects of like components of the CCW portion of system 10. A diode 76 may have an anode connected to the triac 13 output line 75 and a cathode connected to line 37. The manner in which current is provided via line 37 to power supply 50, in lieu of the current from the diode module 60, by triac 13 may be the same as the way the current is provided by triac 12 via diode 36 to line 37.

Figure 2:
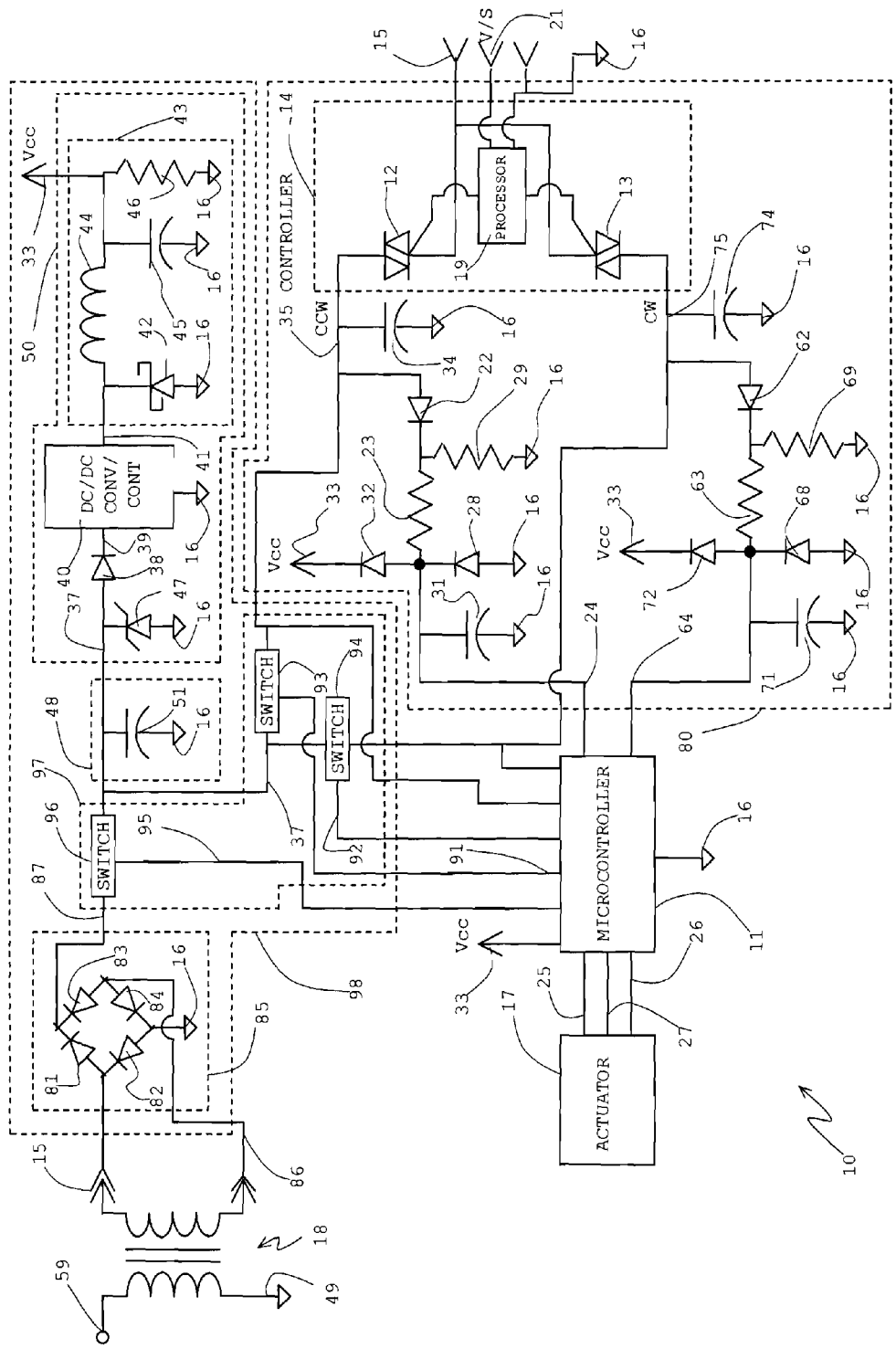
FIG. 2 is a schematic of another version of the system for a controller interface.

The half-wave rectifier 60 in FIG. 1 may be replaced by a full-wave rectifier 85. An example of rectifier 85 is shown in FIG. 2. With rectifier 85 in FIG. 1, one, two or more diodes of the group of diodes 53-56 from the rectifier 60 may be left in the circuit to maintain a sufficiently greater voltage drop than that present at line 37 if one of the triacs 12 and 13 is turned on. Diode 53 may have its anode connected to an output 87 of rectifier 85. Since the ripple is less severe at the output of the full-wave rectifier than at the output of the half-wave rectifier 60, then less capacitance would be required in storage circuit 48. Other devices may be utilized to provide a fully rectified voltage on line 37 to the power supply circuit 50. The full-wave rectifier may be more efficient that the half-wave rectifier.

As shown in FIG. 2, rectifier 85 may have a diode 81 with an anode connected to the input of the rectifier and output terminal or line 15 of the secondary winding of transformer 18 Diode 81 may also have a cathode connected to the output 87. A diode 82 may have a cathode connected to the input of the rectifier and an anode connected to the ground 16. A diode 83 may have a cathode connected to the output 87 and an anode connected to a line or terminal 86 rather than 16, since in this configuration having the rectifier 85 that terminal or line of the secondary winding of transformer 18 is not connected directly to ground 16. A diode 84 may have an anode connected to the anode of diode 83 and a cathode connected to ground 16.

FIG. 2 not only shows an alternative power source, i.e., a full rectifier 85, in lieu of the half-wave rectifier 60, but it also reveals another approach for switching sources of voltage to the power supply circuit 50. Diodes 36 and 76 may be replaced with switches 93 and 94, respectively. Also a switch 96 may be connected in series between the output of rectifier 85 or 60, as this configuration may be used with various rectifiers or sources of rectified voltage. The switches 93, 94 and 96 may be turned on or off with control lines 91, 92 and 95, respectively. These control lines 91, 92 and 95 may be connected to the microcontroller 11 in this configuration but may be operated with some other mechanism. Switches 93, 94 and 96 may be regarded as a switching circuit 97. The switches may be FET's or some other kind of mechanism that may provide a similarly operative. In the case of FET's, the control lines may be connected to gates of the FET's, respectively.

Besides to the switch 93, line 35 may be connected to the microcontroller 11. Similarly, besides to switch 94, line 75 may be connected to microcontroller 11. Microcontroller 11 may sense when there is a voltage at the output of the triac 12 or 13 (indicating that the triac is on) via line 35 or 75, respectively. Upon sensing this voltage, microcontroller 11 may provide a signal to control line 91 or 92 to turn on switch 93 or 94 to connect line 35 or 75, respectively, to line 37. Simultaneously, microcontroller 11 may send a signal via control line to open switch 95 to disconnect the output of the rectifier from line 37 to the input of power supply circuit 50. So, the triac that is on to provide an actuator signal to microcontroller 11 may be providing power to circuit 50. When no triac is on, then power may be provided from the rectifier (full-wave or half-wave) to the power supply circuit 50. It may be possible for microcontroller 11 instead to sense an on voltage of either triac 12 or 13 via the actuator input line 24 or 64, respectively. The sensing mechanism of the microcontroller 11 may be a distinct circuit separate from the microcontroller 11. It may be noted that in some actuator control configurations, that a triac of the triac controller 14 may be on only about ten percent of the time when the system 10 is in operation.

Rectifier 85, switching circuit 97, storage circuit 48 and power supply circuit 50 may be regarded as an interface circuit 98 in FIG. 2. Rectifier 85 may be configured as a half-wave rectifier and still be a part of the interface circuit 98. Similarly in FIG. 1, diode module, voltage drop circuit or supply circuit 60 may be configured as a full-wave rectifier, as long as the appropriate voltage drop is maintained with circuit 60, and still be a part of the interface circuit 88.

In the present specification, some of the matter may be of a hypothetical or prophetic nature although stated in another manner or tense.

Although the invention has been described with respect to at least one illustrative example, many variations and modifications will become apparent to those skilled in the art upon reading the present specification. It is therefore the intention that the appended claims be interpreted as broadly as possible in view of the prior art to include all such variations and modifications.

What is claimed is:

1. A system for interfacing, comprising:

a first controller;

a second controller having an input connected to an output of the first controller for receiving a control signal from the first controller; and an interface device connected to the output of the first controller; and wherein:

the first controller needs a first current at the output to operate;

the second controller needs a second current at the input to operate;

the first current has a minimum value;

the second current has a maximum value;

the minimum value of the first current is greater than the maximum value of the second current;

the interface device uses an amount of current approximately equivalent to a difference between the first current and the second current;

wherein the interface device comprises:

a conditioning circuit having an input connected to the output of the first controller; and a supply circuit having an output connected to the input of the conditioning circuit;

wherein:

the first controller comprises an input for connection to a voltage supply;

the supply circuit comprises an input for connection to the voltage supply;

the first controller has a first voltage drop between the input and the output;

the supply circuit has a second voltage drop between the input and the output;

the second voltage drop is greater than the first voltage drop;

the first voltage drop appears upon the first current occurring at the output of the first controller; and the second voltage drop appears upon a third current occurring at the output of the supply circuit;

the system further comprising:

a first current control device connected in series between the output of the first controller and the input of the conditioning circuit for restricting current flow in one direction from the first controller to the conditioning circuit; and a second current control device connected in series between the output of the supply circuit and the input of the conditioning circuit for restricting current flow in one direction from the supply circuit to the conditioning circuit.

2. The system of claim 1, wherein:

if the first current occurs at the output of the first controller, then the input of the conditioning circuit receives current from the first controller; and if essentially no current occurs at the output of the first controller, then the input of the conditioning circuit receives current from the supply circuit.

3. The system of claim 2, where the conditioning circuit is for providing at least one voltage to the first controller and/or the second controller.

4. The system of claim 3, wherein the output of the first controller includes a triac.

5. The system of claim 4, wherein the second controller is for actuator control.

\* \* \* \* \*

UNITED STATES PATENT AND TRADEMARK OFFICE
CERTIFICATE OF CORRECTION

PATENT NO.       : 7,622,828 B2
APPLICATION NO.  : 11/277112
DATED            : November 24, 2009
INVENTOR(S)      : Grabinger et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 296 days.

Signed and Sealed this

Twenty-sixth Day of October, 2010

David J. Kappos
*Director of the United States Patent and Trademark Office*